United States Patent [19]

Bonora et al.

[11] Patent Number: 4,859,137
[45] Date of Patent: Aug. 22, 1989

[54] APPARATUS FOR TRANSPORTING A HOLDER BETWEEN A PORT OPENING OF A STANDARDIZED MECHANICAL INTERFACE SYSTEM AND A LOADING AND UNLOADING STATION

[75] Inventors: Anthony C. Bonora, Menlo Park; Fred T. Rosenquist, Redwood City, both of Calif.

[73] Assignee: Asyst Technologies, Milpitas, Calif.

[21] Appl. No.: 111,040

[22] Filed: Oct. 21, 1987

[51] Int. Cl.$^4$ ............................................. B65G 65/02
[52] U.S. Cl. .................................... 414/648; 414/652; 414/222
[58] Field of Search ............... 414/648, 652, 424, 422, 414/589, 590, 222, 332, 774, 779, 784, 409, 754, 759, 217; 198/365, 706, 802

[56] References Cited

U.S. PATENT DOCUMENTS

| | | | |
|---|---|---|---|
| 445,611 | 2/1891 | Ruddell | 198/802 |
| 855,141 | 5/1907 | Sommers | 198/802 |
| 4,533,291 | 8/1985 | Nishida | 414/774 |
| 4,674,936 | 6/1987 | Bonora | 414/217 |
| 4,674,939 | 6/1987 | Maney et al. | 414/217 X |
| 4,676,709 | 6/1987 | Bonora et al. | 414/217 |

Primary Examiner—Robert J. Spar
Assistant Examiner—William M. Hienz
Attorney, Agent, or Firm—Fliesler, Dubb, Meyer & Lovejoy

[57] ABSTRACT

An apparatus is provided for transporting a holder for holding articles between a port opening providing access to the system and a loading and unloading station, the apparatus comprising: a first platform for supporting the holder in the course of transport of the holder between the port opening and the station; an elevator for moving the first platform between the port opening and the station; and an assembly for rotatably moving the first platform between a first position in which the first platform is oriented substantially perpendicular to a vertical axis and a second position in which the first platform is inclined relative to the vertical axis; and wherein the assembly moves the first platform between the first and second positions while the elevator moves the first platform between the port opening and the station.

7 Claims, 5 Drawing Sheets

APPARATUS FOR TRANSPORTING A HOLDER BETWEEN A PORT OPENING OF A STANDARDIZED MECHANICAL INTERFACE SYSTEM AND A LOADING AND UNLOADING STATION

BACKGROUND OF THE INVENTION

1. Field of the Invention

The present invention relates to a manipulating apparatus for use with Standardized Mechanical Interface (SMIF) systems and more particularly to an apparatus for transferring a holder for holding articles to be processed into and out of a port opening of a SMIF system.

2. Description of the Related Art

In recent years a Standardized Mechanical Interface (SMIF) has been proposed to reduce particle contamination of articles which require manufacture in substantially particle-free environments. Such articles, for example, may comprise semiconductor integrated circuits. The SMIF system significantly reduces particle fluxes onto such articles. This reduction is accomplished by mechanically ensuring that during transport and storage of the articles, the gaseous media (such as air or nitrogen for example) surrounding the articles is essentially stationary relative to the articles, and also by ensuring that particles from the ambient outside environment do not enter a sealed environment occupied by the articles. Also, processing equipment is isolated from the general environment and HEPA filtered air is provided locally.

Control of particulate contamination is imperative in the manufacture of semiconductor integrated circuits for cost effective, high-yielding and profitable manufacturing of VLSI circuits. Because design rules increasingly call for smaller and smaller lines and spaces, it is necessary to exert greater and greater control on the number of particles and to remove particles with smaller and smaller diameters.

Contamination during integrated circuit manufacture can cause process defects, such as incomplete etching in spaces between lines. Incomplete etching can lead to an unwanted electrical bridge between the lines. Additionally, contamination may cause electrical failure due to induced ionization or trapping of centers in gate dielectrics or junctions.

Modern integrated circuit processing equipment must be concerned with particle sizes which range from below 0.01 micrometers to above 200 micrometers. Contamination by particles in these size ranges can be damaging in semiconductor processing. Typical semiconductor processes today employ geometries which are on the order of 1 micrometer and less. Contaminating particles which have geometries measuring greater than 0.1 micrometer can substantially interfere with 1 micrometer geometry semiconductor devices. The trend, of course, is toward even smaller semiconductor processing geometries.

Today, generally accepted semiconductor manufacturing procedures include the establishment of "clean rooms" in which, through filtering and other techniques, the removal is sought of all particles having geometries of approximately 0.3 micrometer and above. There is a need, however, to improve the processing environment by removing particles having even smaller diameters. Unfortunately, it has been extremely difficult to achieve and maintain conventional clean rooms substantially free of particles of a 0.5 micrometer size and below.

In the past, the main sources of particulate contamination have been personnel, equipment, and chemicals. Particles emitted by personnel can be transmitted, through physical contact or migration, to the surfaces of integrated circuits under manufacture. People, by shedding of skin flakes, for example, can be a significant source of particles that easily can be ionized and cause defects. Although clean room garments reduce particle emissions they do not fully contain the emissions. It has been found that as many as 6000 particles per minute can be emitted into an adjacent one cubic foot of space by a fully suited operator.

In order to control contaminating particles, some manufacturers of integrated circuits have built even more elaborate and expensive clean rooms with HEPA and ULPA recirculating air systems. In order to obtain acceptable levels of cleanliness in such recirculating systems manufacturers have found it necessary to achieve filter efficiencies of 99.999% and to complete up to ten air exchanges per minute.

In order to minimize process defects, processing equipment manufacturers also must prevent machine generated particles from reaching the wafers, and suppliers of gases and liquid chemicals must deliver cleaner products. Most importantly, a system must be designed that will effectively isolate integrated circuits and the semiconductor wafers from which they are produced from particles during storage, transport and transfer to and from processing equipment. The SMIF system has been proposed to achieve this goal. The SMIF concept is based on the realization that a small volume of still, substantially particle-free air, with substantially internal source of particles, is the cleanest possible environment for wafers. Further details of one proposed system are described in the article "SMIF: A TECHNOLOGY FOR WAFER CASSETTE TRANSFER IN VLSI MANUFACTURING", by Mihir Parikh and Ulrich Kaemph, *Solid State Technology*, July 1984, pp. 111–115.

The proposed SMIF system has three main components, namely, (1) minimum volume, substantially contamination-free containers used for storing and transporting cassettes holding articles to be processed; (2) canopies placed o cassette ports of processing equipment so that the environments inside the containers and canopies become miniature clean spaces; and (3) doors on the containers designed to mate with doors on the interace ports of the equipment canopies such that the two doors can be opened simultaneously causing particles which may have been on external door surfaces to be trapped ("sandwiched") between the doors.

In the proposed SMIF system, a container is placed at a port on a canopy of the SMIF system; latches release the container door and the canopy port door simultaneously. A mechanical elevator moves the two doors, with a holder holding articles to be processed riding on top, into the canopy covered space. A manipulator picks up the holder and places it onto the elevator or other location within the canopy. After processing, the reverse operation takes place.

Since the SMIF system involves the restriction of articles to be processed to relatively small self-contained areas, there is a trend toward increasing automation of the internal transport of articles within the system. This trend stems, at least in part, from a desire to control the movement of articles and working components within the system so as to reduce the threat of particle contamination.

Typically, articles to be processed using the SMIF system are carried within a holder such as a cassette. One problem which has developed in conjunction with the use of cassettes involves difficulty in properly loading the cassette into the SMIF system. Since the SMIF system is increasingly automated, it is important to properly align and position the cassette during loading so that the articles to be processed can be extracted from and returned to the cassette by automated means.

Another problem which has developed involves maintaining articles to be processed in a proper seating position within the cassette. Articles such as wafers can slide partially out of their resting places within cassette during loading and unloading of the cassette within the SMIF system. Unfortunately, such articles can suffer damage during passage of the cassette through port openings of the system, for example, when the articles collide with a rim of a port opening during passage of the cassette through the opening.

Thus, there has been a need for an apparatus for achieving proper alignment and positioning of a cassette during the transport of the cassette within a SMIF system and for an apparatus for ensuring that articles held by the cassette are properly seated within the cassette. The present invention meets these needs.

SUMMARY OF THE INVENTION

The present invention provides an apparatus for transporting a holder for holding articles between a port opening within a standard mechanical interface system and a loading and unloading station. The apparatus includes a first platform for supporting the holder in the course of transport of the holder between the port opening and the station. An elevator moves the first platform between the port opening and the station. An assembly rotatably moves the first platform between a first position in which the first platform is oriented substantially perpendicular to a vertical axis and a second position in which the first platform is inclined relative to the vertical axis. The assembly operates to move the first platform between the first and second positions while the elevator moves the first platform between the port opening and the station.

The invention advantageously facilitates the proper positioning of the holder for insertion through the port opening. Moreover, the invention helps to ensure that articles are properly seated within the holder when the holder is inserted through the port opening.

These and other features and advantages of the present invention will become more apparent from the following detailed description of exemplary embodiments thereof, as illustrated in the accompanying drawings.

BRIEF DESCRIPTION OF THE DRAWINGS

The purpose and advantages of the present invention will be apparent to those skilled in the art from the following detailed description in conjunction with the appended drawings in which.

DETAILED DESCRIPTION OF THE PREFERRED EMBODIMENT

Figure 1:
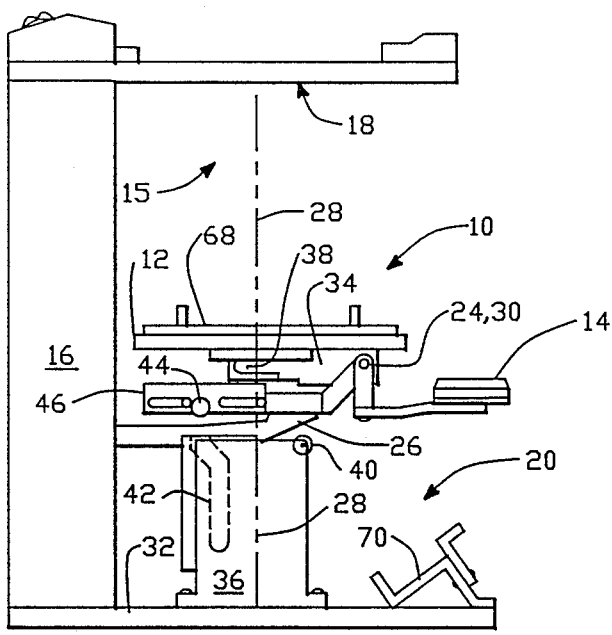
FIGS. 1-5 provide side elevation views of a first embodiment of the invention in successive stages of operation.

The present invention comprises a novel apparatus for use in conjunction with a SMIF system. The following description is presented to enable any person skilled in the art to make and use the invention and is provided in context of a particular application and its requirements. Various modifications to the preferred embodiments will be readily apparent to those skilled in the art, and the generic principles defined herein may be applied to other embodiments of the application without departing from the spirit and scope of the invention. Thus, the present invention is not intended to be limited to the embodiments shown but is to be accorded the widest scope consistent to the principles and features disclosed herein.

Referring now to the illustrative drawings of FIGS. 1-5, there is shown an apparatus 10 according to the present invention. The apparatus 1 includes respective first and second support platforms 12 and 14. An elevator 16 moves the respective first and second support platforms 12 and 14 between a first region indicated generally by arrow 15 adjacent to a port opening 18 which provides access to a SMIF container (not shown and which forms no part of the present invention) and a second region adjacent to a loading and unloading station indicated generally by arrow 20 where, for example, a cassette 22 holding semiconductor wafers (not shown) can be loaded onto or taken from the respective first and second support platforms 12 and 14.

Details of the elevator 16 are not shown. However, those skilled in the art will understand how to implement the elevator 16 using conventional means such as a lead screw coupled to a motor (both not shown). For example, commonly assigned U.S. Pat. No. 4,676,709, issued on June 30, 1987, entitled "Long Arm Manipulator for Standard Mechanical Interface Apparatus", discloses a suitable elevator. Furthermore, for example, commonly assigned U.S. Pat. No. 4,674,936, issued on June 23, 1987, entitled "Short Arm Manipulator for Standard Mechanical Interface Apparatus", discloses a suitable elevator.

A first grooved member 34 extends beneath first support platform 12. The first grooved member 34 and the second support platform 14 are rotatably secured by the respective pin 24 to a support arm 26 coupled to the elevator 16. As described more fully below, the elevator 16 moves the support arm 26 vertically parallel to a first axis 28 extending between the port opening 18 and the station 20. The first and second support platforms 12 and 14 are secured to the support arm 26 so as to move vertically with it. Furthermore, as illustrated in the sequence of drawings in FIGS. 1-5, the first and second support platforms 12 and 14 rotate about a rotation axis 30 as they move vertically with the support arm 26.

A base member 32 is disposed adjacent to the loading and unloading station 20. A second grooved member 36 is secured to and upstands from the base member 32 in the vicinity of the station 20. The second grooved member 36 extends in a direction generally parallel to the first axis 28 such that the second grooved member 36 is disposed adjacent to but not directly in the path of the support arm 26 as it moves between the port opening 18 and the station 20.

A first cam groove 38 is formed in the first grooved member 34. The first cam groove 38 is sized to receive a first cam follower 40. The first cam follower 40 comprises a rotatable cylindrical member which depends from an upper outside corner portion of the second grooved member 36; such that the first cam follower 40 is spaced from the elevator 16 and is adjacent to the station 20. A portion of the first cam follower 40 is illustrated in the drawings by dashed lines since, as explained below, it depends from a side of the second grooved member 36 facing away from the drawing view.

A second cam groove 42 is formed in the second grooved member 36. The second cam groove 42 serves as a cam which is sized to receive a second cam follower 44. The second cam follower 44 comprises a cylindrical rotatable member which depends from a slotted first slideable member 46 which is slideably secured to the support arm 26 as described below. The second cam groove 42 is illustrated in the drawings by dashed lines since, as explained below, it is formed in the side of the second grooved member 36 facing away from the drawing view.

Figure 6:
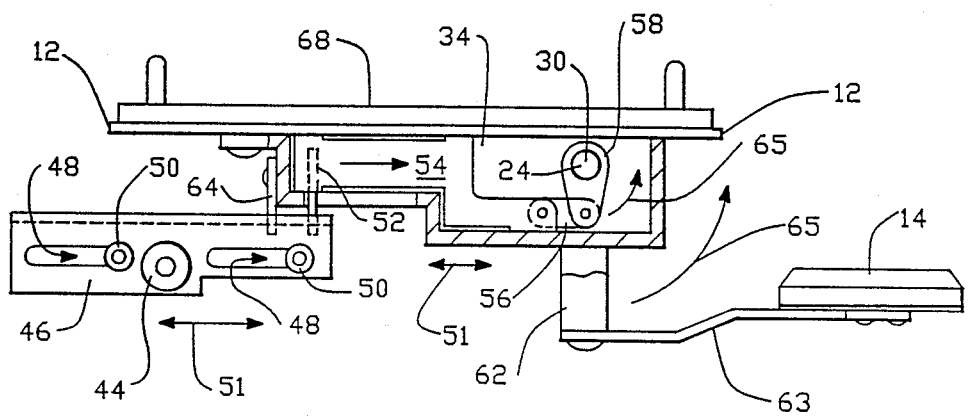
FIGS. 6-7 provide partially sectional side elevation views illustrating details of portions of the first embodiment of FIGS. 1-5.
Figure 7:
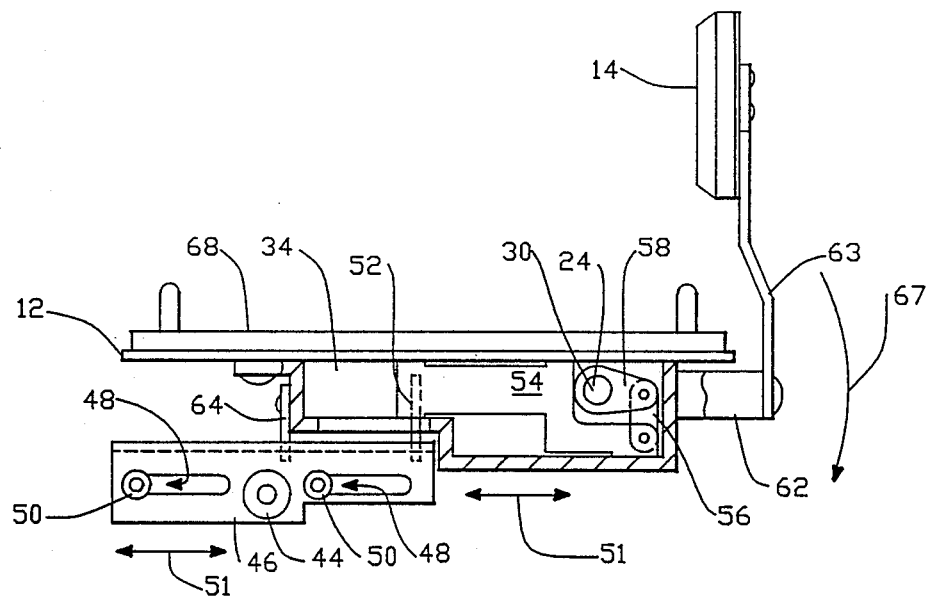

Referring now to the illustrative drawings of FIGS. 6 and 7 there are shown details of the slotted first slideable member 46 and its coupling to the support arm 26 (not shown in FIGS. 6 and 7). The first slideable member 46 has two elongated slots 48 cut completely through it. Respective pins 50 depend from the support arm 26 and extend through each of the respective slots 48. The pins 50 include enlarged head portions which overlap the edges of the respective slots 48 so as to slideably secure the first slideable member 46 to the support arm 26.

The first slideable member 46 is coupled by coupling means 52 (shown with dashed lines), such as a dowel pin, to a second slideable member 54. The respective first and second slideable members 46 and 54 are coupled so as to move as a single unit. The slideable paths of the first and second slideable members 46 and 54 are constrained by the two slots 48 and the associated two pins 50. The paths are indicated by the arrows labelled 51. As explained below, the first and second slideable members 46 and 54 can be caused to slideably move along their paths 51 by the cooperation of the second cam groove 42 and the second cam follower 44.

The second slideable member 54 is coupled through first link member 56 (shown with dashed lines) to a rotatable second link member 58. The second link member 58 is coupled through the pin 24 to a first arm segment 62. A second arm segment 63 is coupled to ends of the first arm segments 62 distal from the second link member 58. (It will be appreciated that there is another set of first and second link members 56 and 58 shaped, configured and coupled in the same manner as those just described but which are not visible in the drawings.) The second arm segment 63 extends perpendicular to the first arm segment 62. The second support platform 14 is coupled to an end of the second arm segment 63 distal from the first arm segment 62.

It will be appreciated that the slideable movement of the respective first and second slideable members 46 and 54 along the paths 51 in a direction toward the second support platform 14 causes the second support platform 14 to be rotated in a counter-clockwise direction indicated by arrow 65 so as to become disposed adjacent to the first support platform 12 and to become oriented perpendicular to it. Conversely, the slideable movement of the members 46 and 54 along paths 51 in a direction away from the second support platform 14 causes the second support platform 14 to be rotated in a clockwise direction indicated by arrow 67 so as to become disposed spaced apart from the first support platform 12.

Figure 8:
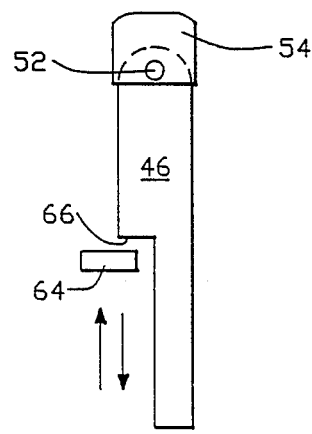
FIG. 8 provides a top elevation view of a locking mechanism of the embodiment of FIGS. 1-7.

The drawing of FIG. 8 illustrates how the first slideable member 46 operates in conjunction with a locking bracket 64 to prevent the first support platform 12 and the first grooved member 34 from incurring unwanted rotation about rotation axis 30. More particularly, the first slideable member 46 includes a tongue portion 66 which extends partially along the length of the member 46 in the vicinity of the second slideable member 54. Referring to FIGS. 6 and 7, the locking bracket 64 depends from a bottom portion of the first support platform 12. When the first slideable member 46 is in the position shown in FIG. 6, the locking bracket 64 fits beneath the tongue portion 66 preventing rotation of the first support platform 12 and the first grooved member 34 about the first axis 30. However, when the first slideable member 46 is in the position shown in FIG. 7, the tongue portion 66 has been slid clear of the locking bracket 64, and the first support platform 12 and the first grooved member 34 can rotate relative to the rotation axis 30.

In operation, the elevator 16 moves the support arm 26 vertically substantially along the first axis 28 between the port opening 18 and the loading and unloading station 20. As the support arm 26 moves along the first axis 28, the engagement of the respective first and second cam followers 40 and 44 with the respective first and second cam grooves 34 and 42 cause the respective first and second support platforms 12 and 14 to rotate relative to the rotation axis 30.

More specifically, referring to FIG. 1, when the support arm 26 begins to descend from the first region 15 adjacent to the port opening 18, both the first and second support platforms 12 and 14 are oriented substantially perpendicular to the first axis 28. Although not shown in the drawings, it will be appreciated that a SMIF container can rest upon a port surface 68 above the first and second support platforms 12 and 14 such that a SMIF container door (not shown) is aligned with the port opening 18. The elevator 16 can cause first support platform 12 to be inserted through the port opening 18 such that the platform 12 is adjacent to the SMIF container door. The container door can be released from the container by means which will be understood by those skilled in the art and need not be described herein. The container door then can rest upon the first support platform 12 and move with it along the first axis 28.

The method and apparatus by which the container door becomes decoupled from the SMIF container forms no part of the invention and need not be described herein. However, in the interest of completeness, applicant references commonly assigned U.S. Pat. No. 4,674,939, issued June 23, 1987, entitled "Sealed Standard Interface Apparatus."

The elevator 16 moves the support arm 26 (and the container door resting thereon) downward in the direction of the base member 32. As shown in FIG. 1, during the initial stages of the descent, both the first support platform 12 is oriented substantially horizontally. During these initial stages, the second support platform 14 is disposed in spaced apart relation to the first platform 12 such that the second platform 14 does not interfere with the passage of the first platform 12 through the port opening 18.

Figure 2:
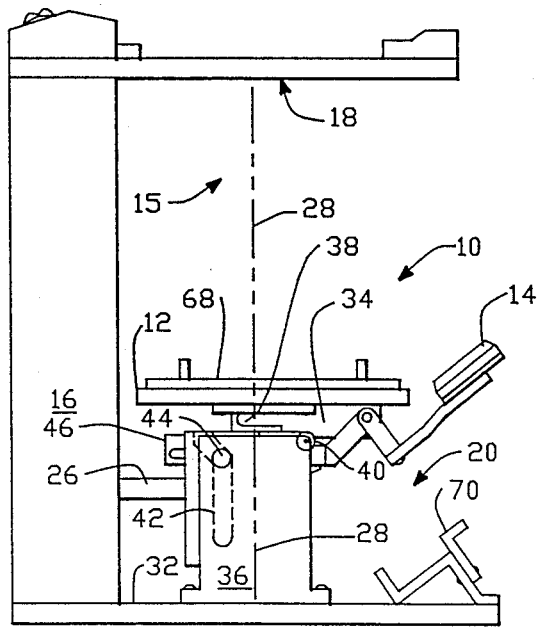

Referring to FIG. 2, as the support arm 26 moves downward, the second cam follower 44 engages the second cam groove 42 causing the respective first and second arm segments 62 and 63, and the second support platform 14 attached thereto, to rotate in a counter-clockwise direction. Referring to FIGS. 6 and 7, it will be understood that as the support arm 26 moves downward, and the second cam follower 44 moves through the second cam groove 42, the first and second slideable members 46 and 54 move along path 51 toward the second platform 14. The movement of those two members 46 and 54 is translated by the respective first and second link members 56 and 58 and by the respective first and second arm segments 62 and 63 to the second sup support platform 14 which rotates counter-clockwise toward the first platform 12.

Figure 3:
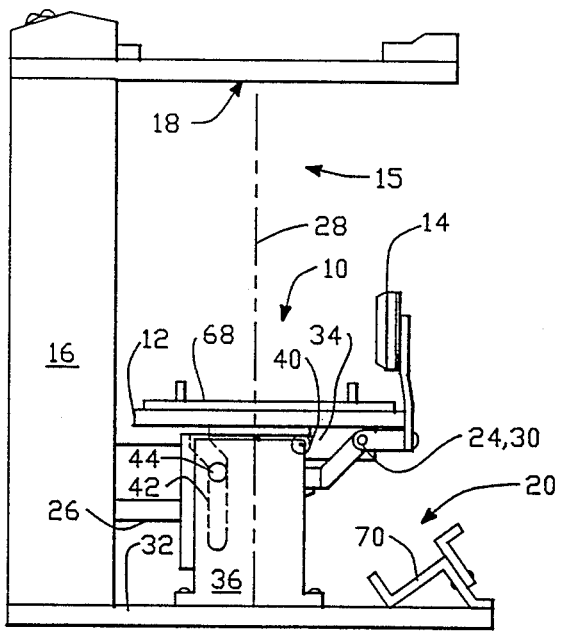

Referring to FIG. 3, the support arm 26 has moved downward such that the second cam groove 42 and the second cam follower 44 have cooperated to cause the second support arm 14 to rotate counter-clockwise about the rotation axis 30 until it is oriented substantially perpendicular to the first support platform 12 as shown. At this point, the first cam follower 40 is about to enter the first cam groove 34. Furthermore, the respective first and second slideable members 46 and 54 have moved toward the second support platform 14 far enough so that the locking bracket 64 is clear of the tongue portion 66, and therefore, the first support platform 12 is not restrained from rotation about the rotation axis 30.

Figure 4:
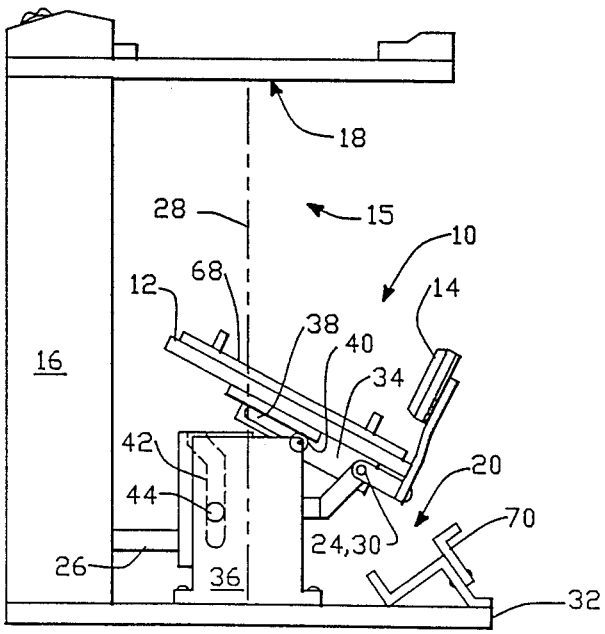

In FIG. 4, the first cam follower 40 is shown cooperating with the first cam groove 34 to cause clockwise rotation of the first support platform 12 about the rotation axis 30. Since the second cam follower 44 is travelling through a portion of the second cam groove 42 which parallels the vertical path of the support arm 26 along the first axis 28, the second support platform 14 rotates clockwise with the first support platform 12 such that the two platforms maintain fixed positions relative to one-another: the first and second support arms 12 and 14 remain disposed adjacent to one another and remain oriented perpendicular to one-another.

Figure 5:
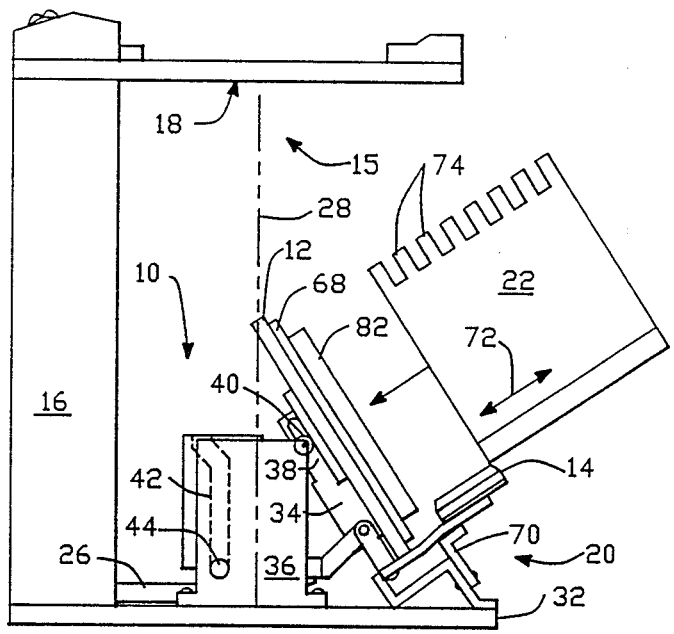

Referring to FIG. 5, the support arm 26 has descended to its lowest point. The respective first and second cam followers 40 and 44 have completed their passages through the respective first and second cam grooves 34 and 42. The first support platform 12 has rotated clockwise about the rotation axis 30 such that it is inclined relative to the first axis 28. The second support platform 14 has rotated about the rotation axis such that the platform maintained a fixed position relative to the first platform 12. Therefore, the two platforms are disposed adjacent to one-another and are oriented perpendicular to each other. Finally, the second support platform 14 leans upon a support strut 70 which upstands from the base member 32.

It will be appreciated that, when the two support platforms 12 and 14 are disposed at the loading and unloading station 20 as shown in FIG. 5, a cassette 22 or other holder can be loaded onto the two support platforms 12 and 14 such that it is cradled by the platforms. The arrow labelled 72 indicates the relative vertical direction of the cassette 22.

Moreover, in FIG. 5, the box door 82 is shown to be resting upon the port door 68 which in turn rests upon the first support platform 12. It will be appreciated that the cassette 22 can rest upon the box door 82 during its trip between the port opening 18 and the loading and unloading station 20.

Thus, the cassette 22 is loaded onto the platforms 12 and 14 at an incline relative to its own vertical direction. This inclined placement has the advantage of ensuring that the cassette 22 easily can be properly slid into position on a container door (not shown) resting on the first platform 12 such that the cassette can be properly loaded into a SMIF container.

The inclined placement also has the advantage of ensuring that articles such as semiconductor wafers, for example, resting upon shelves 74 within the cassette 22 slide into a proper seating position on the shelves 74 within the cassette 22. Proper seating is important in ensuring that the articles do not protrude from the cassette 22 such that they can be damaged by coming into contact with the edges of the port opening 18 as the cassette 22 is raised into the SMIF container.

In order to transport a cassette 22 placed onto the support platforms 12 and 14 from the loading and unloading station 20 to the port opening 18, the reverse of the steps just described with respect to FIGS. 1-5 takes place. Therefore, the present invention provides an efficient apparatus 10 for moving holders containing articles to be processed between a port opening 18 and a loading and unloading station 20.

Figure 9:
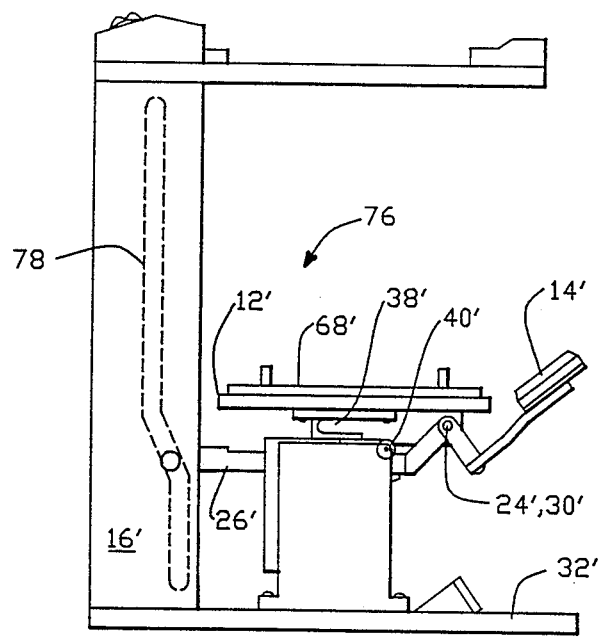
FIG. 9 provides a side elevation view of a second embodiment of the invention.

Referring now to the illustrative drawings of FIG. 9, there is shown alternative embodiment of the invention. In the alternative embodiment, an alternative apparatus 76 includes essentially the same components as the apparatus 10 described above with certain exceptions noted below. In FIG. 9, components of the alternative embodiment 76 which are essentially the same as and which correspond to those of the apparatus 10 discussed above are designated by primed reference numerals identical to those used to denote corresponding components in FIGS. 1-8.

In the alternative embodiment 76, the second cam groove 78 and the second cam follower 80 are disposed adjacent to the elevator 16'. Otherwise, the apparatus 10 described above and the alternative apparatus 76 are essentially identical.

The positioning of both the second cam groove 78 and the second cam 80 adjacent to the elevator 16' offers at least two advantages. First, the second cam groove 78 and the second cam 80 can be positioned outside of a clean SMIF system environment (see Background of the Invention) within which the platforms 12 and 14 and most of the other components of the alternative apparatus 76 can be enclosed. It should be noted that the elevators 16 and 16' in both the apparatus 10 and the alternative apparatus 76 can be positioned outside of such a clean SMIF environment. This placement outside reduces the number of components within such a clean environment which rub against one-another and, therefore, reduces the threat of contamination due to such rubbing.

Second, since the threat of contamination from such rubbing is reduced, the length of the second cam groove 78 can be increased such that the second cam follower 80 never leaves the groove 78 during the movement of the support arm 26'. By maintaining the second cam follower 80 within the second cam groove 78 throughout the range of movement of the support arm 26', there is less danger of misalignment of the second cam groove 78 and the second cam follower 80. Such misalignments, if they were to develop in the first described apparatus 10, by comparison, could hinder entry of the second cam follower 44 into the second cam groove 42.

It will be understood that the above-described embodiments are merely illustrative of many possible specific embodiments which can represent the principles of the invention. Numerous and varied other arrangements can readily be devised in accordance with these principles without departing from the spirit and scope of the invention. Thus, the foregoing description is not intended to limit the invention which is defined in the appended claims.

What is claimed is:

1. For use in a standardized mechanical interface system, an apparatus for transporting a holder for holding articles between a port opening providing access to the system and a loading and unloading station, the apparatus comprising:
   first means for supporting the holder in the course of transport of the holder between the port opening and the station;
   second means for moving said first means between the port opening and the station;
   third means for moving said first means between a first position in which said first means is oriented substantially perpendicular to a vertical axis and a second position in which said first means is inclined relative to the vertical axis wherein said third means includes a first cam and a first cam follower;
   wherein said third means moves said first means between the first and second positions while said second means is in the course of moving said first means between the port opening and the the station;
   fourth means for supporting the holder in the course of transport of the holder between the port opening and the station; and
   fifth means for moving said fourth means between a third position substantially spaced apart from said first means and a fourth position substantially adjacent to said first means, wherein said fifth means includes a second cam and a second cam follower.

2. For use in a standardized mechanical interface system, an apparatus for transporting a holder for holding articles between a port opening providing access to the system and a loading and unloading station, the apparatus comprising:
   first means for supporting the holder in the course of transport of the holder between the port opening and the station, said first means including a first support platform for supporting the holder;
   second means for supporting the holder in the course of transport of the holder between the port opening and the station, said second means including a second support platform for supporting the holder;
   third means for moving said first means and said second means substantially parallel to a first axis extending between the port opening and the station;
   fourth means for moving said first support platform between a first position in which said first support platform is oriented substantially perpendicular to a vertical axis and a second position in which said first support platform is inclined relative to the vertical axis;
   wherein said fourth means includes a first cam and first cam follower;
   fifth means for moving said second support platform between a third position substantially spaced apart from said first support platform and a fourth position substantially adjacent to said first support platform;
   wherein said fifth means includes a second cam and a second cam follower;
   wherein said respective fourth means and fifth means are adapted to respectively move said first support platform and said second support platform while said third means moves said first and second means, such that said first support platform is disposed in the first position when said second support platform is disposed in the third position, and such that said first support platform is disposed in the second position when said second support platform is disposed in the fourth position; and
   wherein said fourth means moves said first support platform such that said first support platform is in the first position when said first means is disposed substantially adjacent to the port opening; and
   such that said first support platform is in the second position when said first means is disposed substantially adjacent to the station.

3. The apparatus of claim 2 wherein:
   said third means includes a support arm for supporting said first means and said second means.

4. The apparatus of claim 3 and further comprising:
   sixth means for rotatably supporting said first means and said second means on said support arm such that said first support platform can rotate about a rotation axis to move between the first and second positions, and such that said second support platform can rotate about the rotation axis to move between the third and fourth positions.

5. The apparatus of claim 4 and further comprising a base member for being disposed adjacent to the station; and
   a first member secured to said base member and having a dimension which extends in a direction toward the port opening.

6. The apparatus of claim 5 wherein:
   said first cam comprises a first groove formed in said first means and is sized to slideably engage said first cam follower;
   said first cam follower is rotatably secured to said first member;
   said second cam comprises a second groove formed in said first member and is sized to slideably engage said second cam follower; and
   said second cam follower is rotatably secured to said support arm.

7. For use in a standardized mechanical interface system, an apparatus for transporting a holder for holding articles between a port opening providing access to the system and a loading and unloading station, the apparatus comprising:
   a support arm;
   first support platform for supporting the holder, said first support platform rotatably secured to said support arm such that said first support platform can rotate between a first position in which said first support platform is oriented substantially perpendicular to a vertical axis and a second position in which said first support platform is inclined relative to the vertical axis;
   second support platform for supporting the holder, said second support platform being rotatably secured to said support arm such that said second support platform can rotate between a third position substantially spaced apart from said first support platform and a fourth position substantially adjacent to the first support platform;

means for moving said support arm and said respective first and second support platforms substantially parallel to a first axis extending between the port opening and the station;

a base member being disposed adjacent to the station;

a first cam follower;

a first member secured to said first support platform so as to move therewith and having a first cam, comprising a first groove, formed therein, said first groove being sized to slideably engage said first cam follower;

a second member secured to said base member and having a dimension which extends in a direction substantially parallel to the first axis, said first cam follower being rotatably secured to said second member;

wherein said first cam follower is adapted to engage said first groove of said first cam such that while said means for, moving moves said first member and said support arm, said first cam and said first cam follower cause said first support platform to rotate such that said first support platform is in the first position when adjacent to the port opening and is in the second position when adjacent the station;

a second cam follower rotatably secured to said support arm; and a second cam, comprising a second groove, formed in said second member and sized to slideably engage said second cam follower;

wherein said second cam follower is adapted to engage said second groove of said second cam such that while said means for moving moves said support arm, said second cam and said second cam follower cause said second support platform to rotate such that said second support platform is in the third position when said first support platform is in the first position and such that said second support platform is in the fourth position when said first support platform is in the second position.

* * * * *